US006336365B1

(12) United States Patent
Blackadar et al.

(10) Patent No.: US 6,336,365 B1
(45) Date of Patent: Jan. 8, 2002

(54) LOW-COST ACCELEROMETER

(75) Inventors: Thomas P. Blackadar, Natick, MA (US); Victor E. Shiff, Merrimack, NH (US)

(73) Assignee: Personal Electronic Devices, Inc., Southborough, MA (US)

(*) Notice: Subject to any disclaimer, the term of this patent is extended or adjusted under 35 U.S.C. 154(b) by 0 days.

(21) Appl. No.: 09/382,049

(22) Filed: Aug. 24, 1999

(51) Int. Cl.$^7$ .............................................. G01P 15/09
(52) U.S. Cl. ................................................... 73/514.34
(58) Field of Search .......................... 73/514.34, 514.32

(56) References Cited

U.S. PATENT DOCUMENTS

| | | | |
|---|---|---|---|
| 4,675,960 A | 6/1987 | Higgins, Jr. .............. 29/25.35 |
| 4,982,599 A | * 1/1991 | Komurasaki .................. 73/35 |
| 5,063,782 A | 11/1991 | Kellett ........................ 73/654 |
| 5,128,581 A | * 7/1992 | Nakayama et al. ......... 310/329 |
| 5,388,459 A | * 2/1995 | Inoue et al. ............. 73/514.34 |
| 5,408,878 A | * 4/1995 | Lysen ...................... 73/514.34 |
| 5,517,073 A | 5/1996 | Ohkuma ..................... 310/315 |
| 5,578,845 A | * 11/1996 | Masuda et al. ............. 257/295 |
| 5,631,421 A | 5/1997 | Ohgke et al. ............ 73/514.34 |
| 5,668,694 A | 9/1997 | Sato et al. ............... 361/321.4 |
| 5,677,487 A | * 10/1997 | Hansen .................... 73/514.34 |
| 5,734,107 A | * 3/1998 | Boehm et al. ........... 73/514.34 |
| 5,824,903 A | * 10/1998 | Nakamura et al. ....... 73/514.34 |
| 5,833,713 A | * 11/1998 | Moberg ....................... 607/19 |

OTHER PUBLICATIONS

"Monolithic Ceramic Capacitors Ceramic Chip Capacitors Cog and Temperature Compensating Types", GRM Series, p. 4.

* cited by examiner

Primary Examiner—Richard A. Moller
(74) Attorney, Agent, or Firm—Wolf, Greenfield & Sacks, P.C.

(57) ABSTRACT

An apparatus is mounted to an object, and a signal from the apparatus is used to monitor the acceleration of the object. The apparatus includes a structure that flexes in response to acceleration of the object, and a transducer supported by the structure so as to generate a signal responsive to flexing of the structure. The structure and the transducer may be constructed and arranged such that a neutral axis passes through the structure when the structure flexes, and such that the neutral axis would still pass through the structure when the structure flexes if the first transducer was removed from the structure. In one embodiment, the apparatus includes a multi-layer, piezoceramic capacitor disposed on a circuit board. In another embodiment, the apparatus includes a disk-shaped, piezoceramic element of the type typically used in microphones or speakers.

62 Claims, 10 Drawing Sheets

LOW-COST ACCELEROMETER

BACKGROUND OF THE INVENTION

1. Field of the Invention

The present invention is directed to methods and devices for monitoring the acceleration of objects.

2. Discussion of Related Art

Piezoelectric materials are commonly used in transducer and actuator applications. A piezoelectric material generates an electric field in response to applied mechanical force, and generates mechanical force in response to an applied electric field. Transducer applications take advantage of the former of these properties, and actuator applications take advantage of the latter. Examples of piezoelectric materials include quartz crystal (which is a naturally occurring crystal commonly used in oscillators), and certain polycrystaline ceramics, e.g., barium titanate, lead metaniobate, lead [Pb] zirconate titanate (PZT), and the like. These types of ceramics are commonly referred to as piezoceramics.

Piezoceramic elements for use as actuators or transducers may be fabricated by precasting and firing a quantity of piezoceramic material into a desired shape, e.g., a rectangle or circle. After being formed, each element is typically subjected to a treatment called prepolarization during which the dipoles of the element are aligned in a chosen direction. This polarization of the element's dipoles causes the element to exhibit its piezoelectric properties. One way to prepolarize a piezoceramic element is to attach a pair of electrodes to opposing surfaces of the element, and to apply a strong electric field across the electrodes while keeping the element at a temperature just below its Curie point. When a piezoceramic element is prepolarized in this manner, the element experiences a permanent increase in dimension in the direction of the applied electric field, i.e., between the electrodes, and experiences a permanent decrease in dimension perpendicular to the direction of the applied electric field, i.e., parallel to the surfaces on which the electrodes are disposed.

After a piezoceramic element has been prepolarized, when a dc voltage of the same polarity as the prepolarizing voltage (but of a lesser magnitude) is applied between the element's electrodes, the element experiences further expansion in the direction of the applied voltage and further contraction perpendicular to the direction of the applied voltage. Conversely, when a dc voltage of the opposite polarity (but of a lesser magnitude) as the prepolarizing voltage is applied between the element's electrodes, the element experiences contraction in the direction of the applied voltage and expansion perpendicular to the direction of the applied voltage. In either case, the piezoceramic element returns to its original shape after the dc voltage is removed from the electrodes. Therefore, such a piezoceramic element can be used as an actuator insofar as the voltage applied across the element's plates cause the element's physical shape to undergo corresponding changes.

This phenomenon also works in reverse. That is, after a piezoceramic element has been prepolarized, when a tension force is applied to the element in a direction parallel to the prepolarization field and/or a compression force is applied to the element perpendicular to the direction of the prepolarization field, the element is caused to expand in the perpendicular direction and contract in the parallel direction. This expansion and contraction, in turn, causes a voltage of the same polarity as the prepolarizing voltage (but of a lesser magnitude) to appear between the electrodes. Conversely, when a compression force is applied to the element in a direction parallel to the prepolarization field and/or a tension force is applied to the element perpendicular to the direction of the prepolarization field, the element is caused to contract in the parallel direction and expand in the perpendicular direction. This contraction and expansion, in turn, causes a voltage of the opposite polarity (but of a lesser magnitude) as the prepolarizing voltage to appear between the electrodes. Therefore, such a piezoceramic element can be used as a transducer insofar as the physical forces applied to the piezoceramic element cause corresponding voltages to be generated between the electrodes.

An example of a prior art acceleration-sensing device 100 which employs a pair of piezoceramic elements as a transducer is shown in FIG. 1. Such a device is disclosed in U.S. Pat. No. 5,631,421, which is hereby incorporated herein by reference. As shown in FIG. 1, the acceleration-sensing device 100 includes a pair of support members 102a and 102b, a piezoceramic beam 104, and a pair of electrodes 106a and 106b. The piezoceramic beam 104 includes two distinct piezoceramic portions 104a and 104b, with a bottom surface 114 of the portion 104a being mated with a top surface 116 of the portion 104b. The beam 104 is sandwiched between the pair of support members 102a and 102b, and the electrodes 106a and 106b are attached, respectively, to a top surface 112 of the portion 104a and a bottom surface 118 of the portion 104b. Each of the portions 104a and 104b is polarized vertically in a direction perpendicular to the top and bottom surfaces of the portions 104a and 104b, but the two portions 104a and 104b are polarized in opposite directions.

In the device 100, a center portion 108 of the beam 104 is held stationary by the support members 102a and 102b, and ends 110a and 110b of the beam 104 are permitted to move freely in response to acceleration of the support members 102a and 102b. The beam 104 is therefore caused to flex when an object (not shown) to which the support members 102a and 102b are attached is subjected to acceleration. When the ends 110a and 110b of the beam 104 flex upward in such a situation, the portion 104a of the beam 104 is subjected to compression forces and is caused to contract (i.e., shorten), and the portion 104b is subjected to tension forces and is caused to expand (i.e., lengthen). Because the portions 104a and 104b are polarized in opposite directions, however, the voltage generated (in response to these compression and tension forces) between the top and bottom surfaces of the respective portions is of the same polarity. Therefore, the voltage produced between the electrodes 106a and 106b when the ends 110a and 110b of the beam 104 flexes upward is equal to a sum of the voltages generated between the top and bottom surfaces of the respective portions 104a and 104b.

Conversely, when the ends 110a and 110b of the beam 104 flex downward, the top portion 104a of the beam 104 is subjected to tension forces and is caused to expand, and the bottom portion 104b is subjected to compression forces and is caused to contract. Therefore, because the portions 104a and 104b are polarized in opposite directions, the voltage produced between the electrodes 106a and 106b when the ends 110a and 110b of the beam 104 flex downward is also equal to a sum of the voltages generated between the top and bottom surfaces of the respective portions 104a and 104b, but is of an opposite polarity as the voltage produced when the ends 110a and 110b flex upward.

Thus, because the beam 104 flexes in proportion to the acceleration of the object (not shown) to which the support members 102a and 102b are attached, the signal generated between the electrodes 106a and 106b (as a result of the portions 104a and 104b of the piezoceramic beam 104 expanding and contracting when the beam 104 flexes) is indicative of the acceleration of the object.

FIG. 2 is a diagram showing another example of a prior art acceleration-sensing device 200 which employs a pair of piezoceramic elements as a transducer. The device of FIG. 2 is disclosed in U.S. Pat. No. 5,063,782, which is hereby incorporated herein by reference. As shown in FIG. 2, the acceleration-sensing device 200 includes an annular, electrically-conductive support member 202; a pair of circular piezoceramic elements 204a and 204b; a circular conductor 212; and a pair of electrodes 206a and 206b. The support member 202 supports an inner section 208 of each of the piezoceramic elements 204a and 204b and the circular conductor 212, such that an outer perimeter 210 of these components is permitted to flex upward and downward with respect to the inner section 208 (forming a spherical shape) when an object (not shown) to which the support member 202 is attached is accelerated.

The electrode 206a is electrically connected to both a top surface 214 of the piezoceramic element 204a and a bottom surface 220 of the piezoceramic element 204b via the electrically conductive support member 202, and the electrode 204b is electrically connected to both a bottom surface 216 of the piezoceramic element 204a and a top surface 218 of the piezoceramic element 204b via the circular conductor 212. An annular insulating ring 222 is positioned between the support member 202 and the circular conductor 212 to electrically isolate each from the other.

As with the acceleration-sensing device 100 of FIG. 1, each of the piezoceramic elements 204a and 204b of the acceleration sensing device 200 is polarized in a direction perpendicular to its top and bottom surfaces so that each element generates a respective voltage between its top and bottom surfaces when the outer perimeter 210 of the device 200 is flexed. In contrast to the device 100 of FIG. 1, however, the elements 204a and 204b are polarized in the same direction. Therefore, when the outer perimeter 210 flexes upward or downward with respect to the support member 202, the expansion and contraction, or vice versa, of the respective top and bottom piezoceramic elements 204a and 204b causes voltages of the same polarity to appear (in parallel) between the electrodes 206a and 204b (via the circular conductor 212 and the support member 202). This configuration is disclosed as being advantageous because the piezoelectric effects of the two piezoceramic elements 204a and 204b are caused to cancel one another.

Although acceleration sensors such as those shown in FIGS. 1 and 2 function satisfactorily for their intended purposes, they tend to be relatively difficult and expensive to produce, and can easily become damaged. That is, because a relatively large quantity of piezoceramic material is required to produce the piezoceramic components of these devices, the cost of the piezoceramic material itself tends to make these types of acceleration sensors prohibitively expensive to use for many applications. Additionally, the process of producing and properly polarizing the relatively large piezoceramic elements required by such devices can be quite difficult and expensive. Further, because the shapes of the piezoceramic components used in these prior art acceleration sensors are required to be large in order to generate an appreciable voltage, these components tend to be fragile and can become damaged easily.

What is needed, therefore, is an improved method for measuring acceleration.

SUMMARY OF THE INVENTION

According to one aspect of the present invention, a method for monitoring acceleration of an object involves providing an apparatus including a non-conductive structure that flexes in response to acceleration of the object, and at least one transducer supported by the structure so as to generate a signal responsive to flexing of the structure. The apparatus is mounted to the object, and the acceleration of the object is monitored based upon the signal.

According to another aspect of the invention, a method for monitoring acceleration of an object involves providing an apparatus including a structure that flexes in response to acceleration of the object, and a first transducer supported by the structure so as to generate a signal responsive to flexing of the structure, wherein the structure and the first transducer are constructed and arranged such that a neutral axis passes through the structure when the structure flexes, and such that the neutral axis would still pass through the structure when the structure flexes if the first transducer was removed from the structure. The apparatus is mounted to the object, and the acceleration of the object is monitored based upon the signal.

According to another aspect of the invention, a method for monitoring acceleration of an object involves providing an apparatus including a structure that flexes in response to acceleration of the object, and at least one transducer supported by the structure so as to generate a signal responsive to flexing of the structure, the at least one, transducer including first and second electrodes, each of the first and second electrodes being connected to a respective pair of conductors, the pair of conductors connected to the first electrode being alternately interdigitated with the pair of conductors connected to the second electrode, the apparatus further including a piezoelectric material disposed between adjacent ones of the conductors. The apparatus is mounted to the object, and the acceleration of the object is monitored based upon the signal.

According to another aspect of the invention, a method for monitoring acceleration of an object involves providing an apparatus including a structure, having a surface area, that flexes in response to acceleration of the object, and at least one transducer supported by the structure so as to generate a signal responsive to flexing of the structure, the at least one transducer covering less than one fourth of the surface area of the structure. The apparatus is mounted to the object, and the acceleration of the object is monitored based upon the signal.

According to another aspect of the invention, a method for monitoring acceleration of an object involves providing an apparatus including a structure that flexes in response to acceleration of the object, and at least one transducer having first and second ends and a middle portion therebetween, wherein the first and second ends of the at least one transducer are mechanically coupled to respective first and second locations on a surface of the structure, without the middle portion being mechanically coupled to the structure, so that the at least one transducer generates a signal responsive changes in a distance between the first and second locations that occur as the structure flexes. The apparatus is mounted to the object, and the acceleration of the object is monitored based upon the signal.

According to another aspect of the invention, a method for monitoring acceleration of an object involves providing an apparatus including a non-circular structure that flexes in response to acceleration of the object, and at least one transducer supported by the structure so as to generate a signal responsive to flexing of the structure. The apparatus is mounted to the object, and the acceleration of the object is monitored based upon the signal.

According to another aspect of the invention, a method for monitoring acceleration of an object involves providing an apparatus including a structure that flexes in response to acceleration of the object, and at least one capacitor having first and second plates, the at least one capacitor being configured and arranged on the structure to generate a signal between the first and second plates responsive to flexing of the structure. The apparatus is mounted to the object, and the acceleration of the object is monitored based upon the signal.

According to another aspect of the invention, a device for monitoring acceleration of an object includes an apparatus including a non-conductive structure that flexes in response to acceleration of the object, and at least one transducer supported by the structure so as to generate a signal responsive to flexing of the structure. The device further includes a controller, coupled to the apparatus to receive the signal therefrom, that monitors the acceleration of the object based upon the signal.

According to another aspect of the invention, a device for monitoring acceleration of an object includes an apparatus including a structure that flexes in response to acceleration of the object, and a first transducer supported by the structure so as to generate a signal responsive to flexing of the structure, wherein the structure and the first transducer are constructed and arranged such that a neutral axis passes through the structure when the structure flexes, and such that the neutral axis would still pass through the structure when the structure flexes if the first transducer was removed from the structure. The device further includes a controller, coupled to the apparatus to receive the signal therefrom, that monitors the acceleration of the object based upon the signal.

According to another aspect of the invention, a device for monitoring acceleration of an object includes an apparatus including a structure that flexes in response to acceleration of the object, and at least one transducer supported by the structure so as to generate a signal responsive to flexing of the structure, the at least one transducer including first and second electrodes, each of the first and second electrodes being connected to a respective pair of conductors, the pair of conductors connected to the first electrode being alternately interdigitated with the pair of conductors connected to the second electrode, the apparatus further including a piezoelectric material disposed between adjacent ones of the conductors. The device further includes a controller, coupled to the apparatus to receive the signal therefrom, that monitors the acceleration of the object based upon the signal.

According to another aspect of the invention, a device for monitoring acceleration of an object includes an apparatus including a structure, having a surface area, that flexes in response to acceleration of the object, and at least one transducer supported by the structure so as to generate a signal responsive to flexing of the structure, the at least one transducer covering less than one fourth of the surface area of the structure. The device further includes a controller, coupled to the apparatus to receive the signal therefrom, that monitors the acceleration of the object based upon the signal.

According to another aspect of the invention, a device for monitoring acceleration of an object includes an apparatus including a structure that flexes in response to acceleration of the object, and at least one transducer having first and second ends and a middle portion therebetween, wherein the first and second ends of the at least one transducer are mechanically coupled to respective first and second locations on a surface of the structure, without the middle portion being mechanically coupled to the structure, so that the at least one transducer generates a signal responsive changes in a distance between the first and second locations that occur as the structure flexes. The device further includes a controller, coupled to the apparatus to receive the signal therefrom, that monitors the acceleration of the object based upon the signal.

According to another aspect of the invention, a device for monitoring acceleration of an object includes an apparatus including a non-circular structure that flexes in response to acceleration of the object, and at least one transducer supported by the structure so as to generate a signal responsive to flexing of the structure. The device further includes a controller, coupled to the apparatus to receive the signal therefrom, that monitors the acceleration of the object based upon the signal.

According to another aspect of the invention, a device for monitoring acceleration of an object includes an apparatus including a structure that flexes in response to acceleration of the object, and at least one capacitor having first and second plates, the at least one capacitor being configured and arranged on the structure to generate a signal between the first and second plates responsive to flexing of the structure. The device further includes a controller, coupled to the apparatus to receive the signal therefrom, that monitors the acceleration of the object based upon the signal.

DETAILED DESCRIPTION OF THE INVENTION

Figure 1:
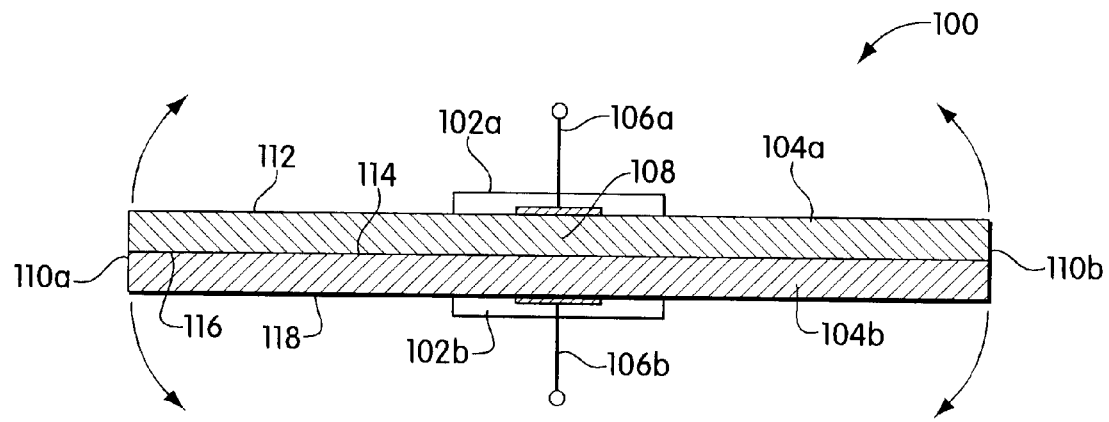
FIG. 1 is a diagram showing an example of a prior art accelerometer that employs a piezoceramic transducer.

As discussed above, when a structure, e.g., a beam or a disk, is caused to flex in response to acceleration or other forces, one side of the structure is subjected to compression forces and is caused to contract, and the opposite side of the structure is subjected to tension forces and is caused to expand. Prior art accelerometer devices that employ transducers made of piezoceramic materials, e.g., the acceleration-sensing devices of FIGS. 1 and 2, exploit this characteristic of flexible structures by using the flexible structures themselves to generate voltages indicative of amounts that the structures are flexed.

In contrast, in one embodiment of the present invention, the flexing of a flexible structure is monitored using a transducer that is attached to the flexible structure, rather than the flexible structure itself, to generate a signal indicative of the structure's flexing. In such an embodiment, when the flexible structure is attached to an object so that the structure flexes in response to acceleration of the object, the transducer generates a signal indicative of the object's acceleration. The transducer in such an embodiment may be any of numerous devices or substances capable of monitoring one or more physical characteristics of the structure that change as the structure flexes, and may be supported by the flexible structure in any of a number of ways achieve this result. The invention is not limited to any particular type of transducer, or to any particular device or technique for securing the transducer to the flexible structure. Additionally, the flexible structure in such an embodiment may take on any of numerous forms, and may be secured to the object in any of a number of ways so that the structure flexes when the object accelerates. The invention is not limited to any particular type of structure or to any particular device or technique for securing the structure to the object whose acceleration is to be monitored. As used herein the term "transducer" refers to any device or substance that is capable of converting input energy of one form, e.g., physical energy, into output energy of another form, e.g., electrical energy.

Figure 3A:
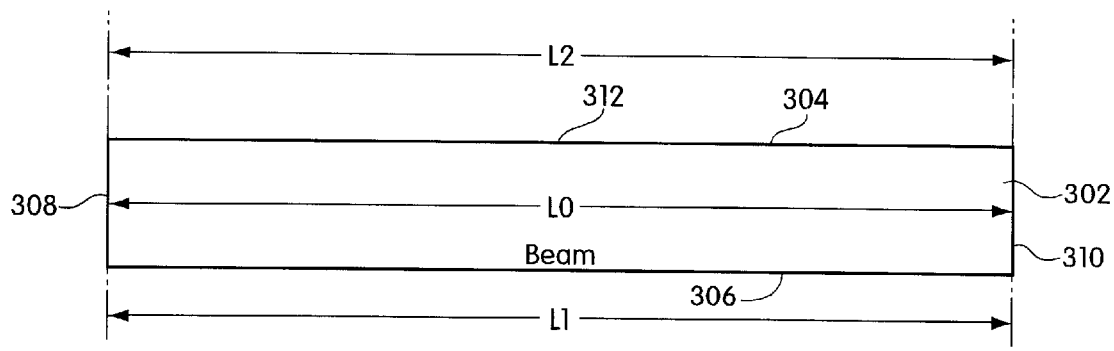
FIGS. 3A–B are illustrations showing how measurable characteristics of a beam can change when the beam is flexed.
Figure 3B:
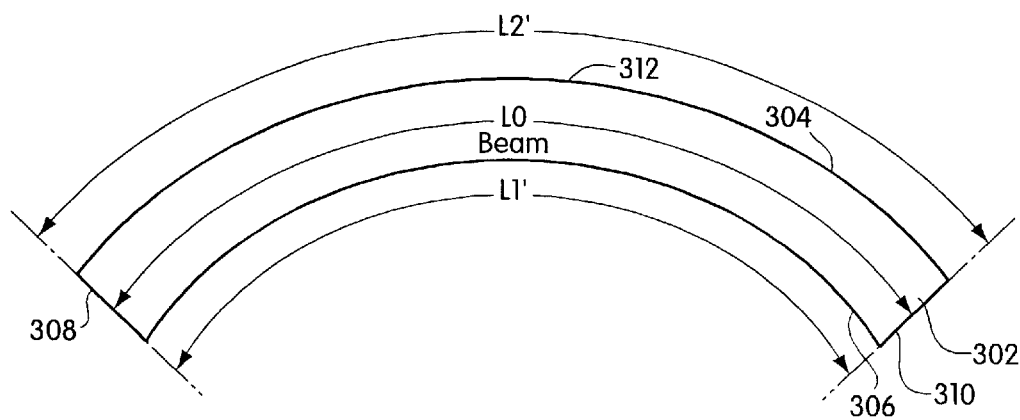

FIGS. 3A–B show an example of a flexible structure that may be secured to an object so that the structure flexes when the object is accelerated. In illustrative example of FIGS. 3A–B, the flexible structure is a beam 302. As mentioned above, however, it should be appreciated that the invention is not limited in this respect, and the any alternative type of structure that exhibits measurable characteristics that change as the structure flexes may be employed. For example, in alternative embodiments, the structure may be primarily two-dimensional (i.e., substantially flat), and be of any shape such as triangular, square, rectangular, trapezoidal, rhombic, oval, round, or the like, or may be three-dimensional and have any number of flat or surfaces of these or different shapes.

In the example of FIGS. 3A–B, one or more portions of the beam 302 may be secured to an object (not shown) whose acceleration is to be monitored so that the beam 302 is caused to flex when the object is accelerated. For example, a first portion, e.g., end 306, of the beam 302 may be held by a support (not shown) that is attached to the object, and a second portion, e.g., end 310, of the beam 302 may be left unsupported so that it can move with respect to the object when the object is accelerated. Alternatively, a first portion, e.g., middle portion 312, of the beam 302 may be secured to the object in some manner so that two second portions, e.g., the two free ends 308 and 310, of the beam 302 are permitted to move with respect to the object when the object is accelerated. Other configurations are also possible to achieve a similar result, and will be readily apparent to those skilled in the art.

Several characteristics of the beam 302 that change as the beam 302 flexes, and that may be monitored by a transducer supported by the structure, are described below with reference to FIGS. 3A–B. However, it should be appreciated that, depending on the particular type of flexible structure used, there may be measurable characteristics of the structure in addition to those described below that change as the structure flexes, and that the invention is not limited to monitoring the specific characteristic(s) described. While the beam 302 in the example of FIGS. 3A–B is shown as flexing only in a downward direction, it should be understood that the beam 302 (or other structure) may also be flexed upwards, sideways, or in any other direction, and that the same or similar measurable characteristic(s) as those described below may be monitored for changes in such situations.

One characteristic of the flexible beam 302 that may be monitored for changes when the shape of the beam 302 is altered from its unflexed position (FIG. 3A) to its flexed position (FIG. 3B) is the length of a particular section of one of the top 304 and bottom surfaces 306 of the beam 302. That is, when the beam 302 flexes (FIG. 3B), the surface 304 on the expanding side of the beam 302 is elongated, and the surface 306 on the contracting side of beam 302 is shortened. As shown in FIG. 3A, when the beam 302 is unflexed, the length L0 across the middle portion of the beam 302 is identical to the lengths L1 and L2 across the bottom and top surfaces 306 and 304, respectively. However, when the beam 302 is flexed as shown in FIG. 3B, the length L0 across the middle portion of the beam 302 remains the same, but the length is L2' across the top surface 304 increases and the length L1' across the bottom surface 306 decreases. Therefore, when the beam 302 is flexed, the length L2' is caused to be longer than the length L0, and the length L1' is caused to be shorter than the length L0. Examples of how transducers may be supported by the beam 302 so as to measure these dimensional changes on the top and bottom surfaces 304 and 306 are described below.

It should be appreciated that dimensional changes also take place internal to the beam 302 when the beam 302 flexes, and that, in alternative embodiments, such dimensional changes may be monitored by one or more properly placed transducers. However, the most significant dimensional changes occur on the top and bottom surfaces 304 and 306 of the beam 302.

Another characteristic of the flexible beam 302 that may be monitored for changes when the shape of the beam 302 is altered from its unflexed position (FIG. 3A) to its flexed position (FIG. 3B) is the amount of tension or compression that is exerted at a particular location within the beam. Therefore, in some embodiments, one or more transducers may be strategically placed within the beam 302 so as to measure stress changes within the beam 302 that occur when the beam 302 flexes.

Yet another characteristic of the flexible beam 302 that may be monitored for changes when the shape of the beam 302 is altered from its unflexed position (FIG. 3A) to its flexed position (FIG. 3B) is the curvature of a particular section of one of the beam's surfaces. The changes in this characteristic are evident from a study of FIGS. 3A–B, and therefore will not be described further. Examples of how transducers may be supported by the beam 302 so as to measure the curvature changes of the top and bottom surfaces 304 and 306 of the beam 302 are described below.

Figure 4A:
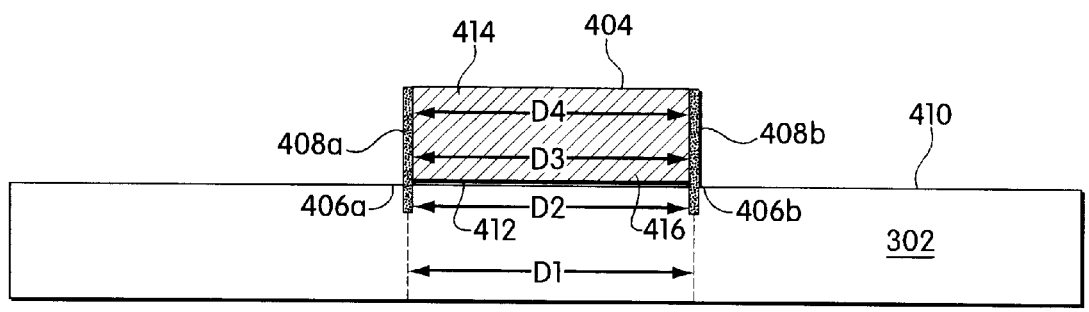
FIGS. 4A–C are illustrations of a transducer mounted on a flexible beam according to one embodiment of the present invention.
Figure 4B:
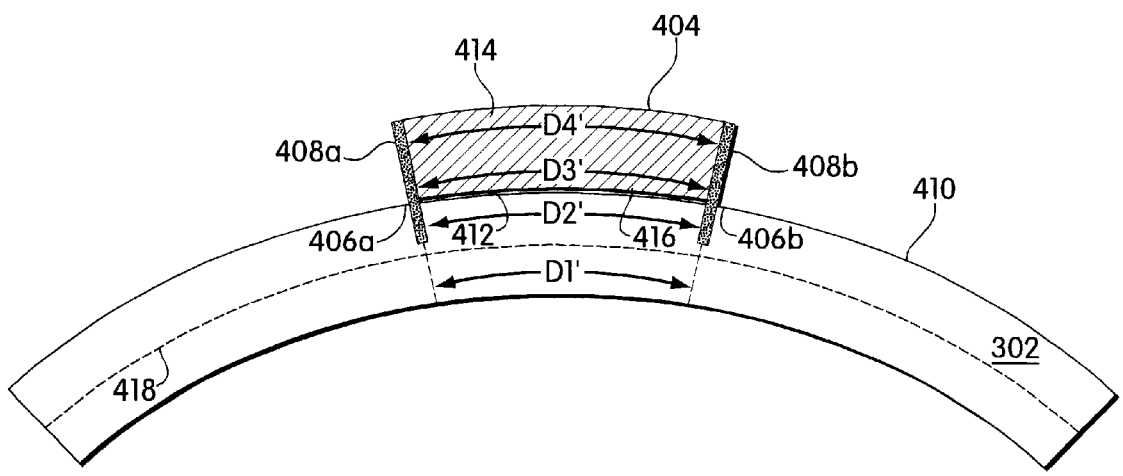
Figure 4C:
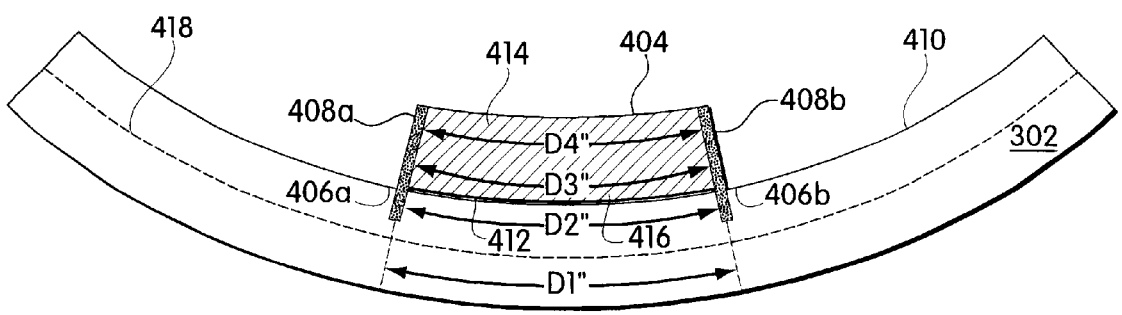

FIGS. 4A–C show an example of how a transducer 404, e.g., a piezoceramic element, piezoresistive element, or the like, may be supported by a flexible structure, e.g., the beam 302 or any other suitable structure, so as to generate a signal responsive to changes in one or more characteristic of the structure that occur when the structure flexes. Therefore, when the beam 302 of the embodiment of FIGS. 4A–C is attached to an object (not shown) so that the beam 302 is caused to flex in response to acceleration of the object, the output of the transducer 404 is indicative of the acceleration of the object. A controller (not shorn) may be coupled to the transducer 404 to receive the output signal therefrom, and may monitor the signal to monitor the acceleration of the object. As used herein, the term "controller" is intended to refer to any circuitry or component(s) used to monitor the signal from a transducer to monitor the acceleration of an object. The invention is not limited to the use of any particular type of controller to perform this monitoring function. The controller which is used to monitor the acceleration of the object may, for example, comprise a simple peak detection circuit. Alternatively, the controller used may comprise a microcontroller chip, or a personal computer, which receives the signal from the transducer.

In the embodiment of FIGS. 4A–C, the transducer 404 is supported by the beam 302 so as to monitor changes in a surface dimension of the beam 302 (i.e., a distance between locations 406a and 406b on a top surface 410 of the beam 302), as well as changes in the curvature of the top surface 410, that occur when the beam 302 flexes.

As shown in FIGS. 4A–C: (1) when the beam 302 is unflexed (FIG. 4A), there is a distance D2 between the locations 406a and 406b; (2) when the beam 302 is flexed downward (FIG. 4B), there is a distance D2' (which is longer than the distance D2) between the locations 406a and 406b; and (3) when the beam 302 is flexed upward (FIG. 4C), there is a distance D2" (which is shorter than the distance D2) between the locations 406a and 406b. In the embodiment of FIGS. 4A–C, supports 408a and 408b (e.g., metal or plastic members used to support the transducer 404 on the beam 302) are disposed on opposite ends of the transducer 404 and are fixedly secured to the locations 406a and 406b, respectively, so that the changes in the dimension D2 that occur when the beam 302 flexes also cause the length D3 of a lower portion 416 of the transducer 404 to change accordingly. It should be appreciated that the supports 408a and 408b, when used, can take on any of numerous forms, and that the invention is not limited to any particular type of supports.

Therefore, as illustrated in FIGS. 4A–C: (1) when the beam 302 is unflexed (FIG. 4A), the lower portion 416 of the transducer 404 has a length D3; (2) when the beam 302 is flexed downward (FIG. 4B), the lower portion 416 of the transducer 404 has a length D3' (which is longer than the length D3); and (3) when the beam 302 is flexed upward (FIG. 4C), the lower portion 416 of the transducer 404 has a length D3" (which is shorter than the length D3). The transducer 404 in the embodiment of FIGS. 4A–C therefore generates a signal responsive to such changes in the length D3 of its lower portion 416.

Additionally, in the embodiment of FIGS. 4A–C, the supports 408a and 408b and/or the transducer 404 are constructed and arranged so that a bottom surface 412 of the transducer 404 is held in direct contact with the top surface 410 of the beam 302 when the beam 302 flexes. In one embodiment, the supports 408a and 408b are rigid enough and are secured to the top surface 410 in such a manner that the physical relationship between each of the supports 408a and 408b and the top surface 410 of the beam 302 is not altered when the beam 302 flexes. This configuration forces the curvature of the bottom surface 412 of the transducer 404 to mimic the curvature of the top surface 410 of the beam 302. In this manner, as shown in FIGS. 4A–C, an upper portion 414 of the transducer 404 elongates from a length D4 (FIG. 4A) to a length D4' (FIG. 4B) when the beam 302 is flexed downward, and shortens from the length D4 (FIG. 4A) to a length D4" (FIG. 4C) when the beam 302 is flexed upward. Therefore, in the embodiment of FIGS. 4A–C, the signal generated by the transducer 404 also is responsive to changes in the length D4 of its upper portion 414 that occur as a result of the curvature of the bottom surface 412 of the transducer 404 mimicking the curvature of the top surface 410 of the beam 302.

The curvature of the bottom surface 412 of the transducer 404 may also be caused to mimic the curvature of the top surface 410 of the beam 302 in a number of other ways. In some embodiments, for example, the entire bottom surface 412 of the transducer 404 may be fixedly secured, e.g., using an adhesive, to the top surface 410 to achieve such a result. In such embodiments, the supports 408a and 408b may or may not also be used to secure the transducer 404 to the top surface 410.

Figure 5A:
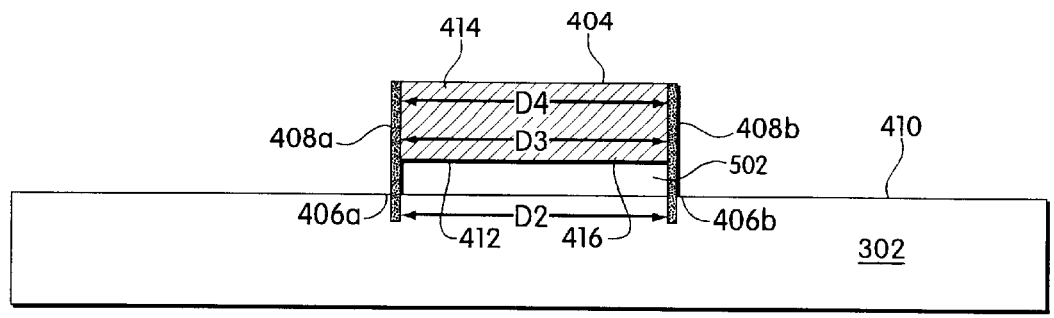
FIGS. 5A–C are illustrations of a transducer mounted on a flexible beam according to another embodiment of the present invention.
Figure 5B:
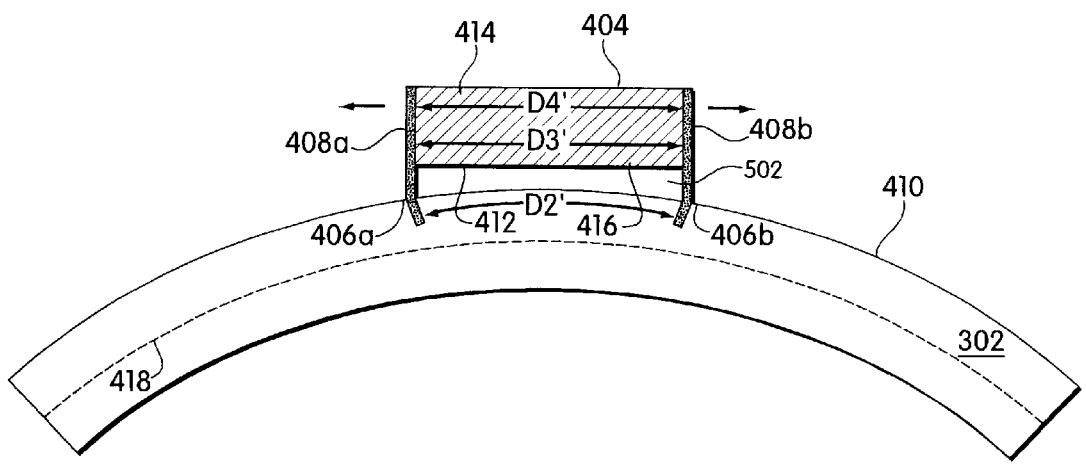
Figure 5C:
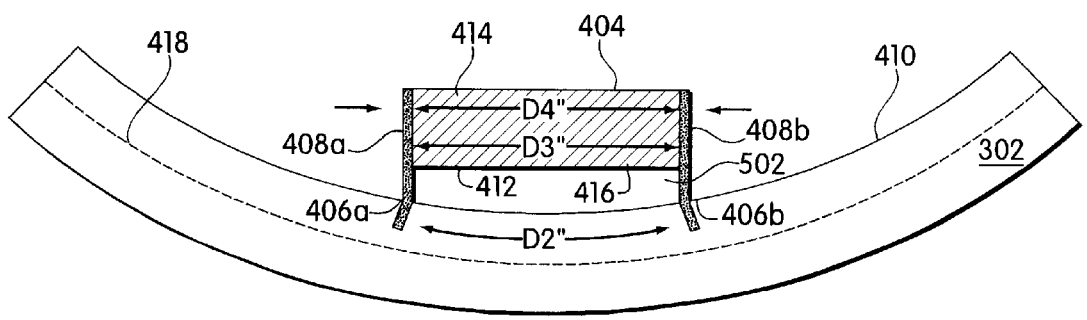

FIGS. 5A–C show another example of how a transducer 404, e.g., a piezoceramic element, a piezoresistive element, or the like, may be supported by a flexible structure, e.g., the beam 302 or another suitable structure, so as to generate a signal responsive to changes in one or more characteristic of the structure that occur when the structure flexes. Therefore, when the beam 302 of the embodiment of FIGS. 5A–C is attached to an object (not shown) so that the beam. 302 is caused to flex in response to acceleration of the object, the output of the transducer 404 is indicative of the acceleration of the object. As discussed above, a controller (not shown) may be coupled to the transducer 404 to receive the output signal therefrom, and may monitor the signal to monitor the acceleration of the object. In the embodiment of FIGS. 5A–C, the transducer 404 primarily monitors changes in a surface dimension of the beam 302, i.e., a distance between the locations 406a and 406b on the top surface 410 of the beam 302.

As shown in FIGS. 5A–C, the transducer 404 may be secured to the locations 406a and 406b on the top surface 410 of the beam 302 using the supports 408a and 408b, respectively, so that a gap 502 is formed between the bottom surface 412 of the transducer 404 and the top surface 410 of the beam 302. In the illustrative embodiment of FIGS. 5A–C, the supports 408a and 408b are made of a material that is flexible enough that the supports 408a and 408b are allowed to deform slightly when the beam 302 flexes. In this manner, when the beam 302 flexes, the curvature of the transducer 404 is not altered significantly, but the transducer 404 is elongated or shortened in the directions indicated by the arrows in FIGS. 5B and 5C.

Specifically, when the beam 302 flexes downward (FIG. 5B), the change in the distance D2 along the top surface 410 of the beam 302 (i.e., from D2 to D2') causes corresponding changes in the lengths of both the top 414 and bottom portions 416 of the transducer 404 (i.e., from D3 to D3', and from D4 to D4'), with the lengths of the top 414 and bottom portions 416 remaining substantially equal to one another when the beam 302 flexes (i.e., D3=D4; D3'=D4'). Similarly, when the beam 302 flexes upward (FIG. 5C), the change in the distance D2 along the top surface 410 of the beam 302 (i.e., from D2 to D2") causes corresponding changes in the lengths of both the top 414 and bottom portions 416 of the transducer 404 (i.e., from D3 to D3", and from D4 to D4"), with the lengths of the top 414 and bottom portions 416 remaining substantially equal to one another when the beam 302 flexes (i.e., D3=D4, and D3"=D4"). Therefore, when a piezoceramic element is used as the transducer 404, the amplitude of the voltage generated by the transducer 404 is affected primarily by the stretching and compression forces exerted on the ends of the transducer 404, and is affected only secondarily, if at all, by any bending forces exerted thereon.

In some embodiments of the invention, a relatively small transducer 404 may be mounted on a beam 302 (or another structure) having a relatively large surface area so that the transducer 404 covers only a small portion (e.g., one fourth, one tenth, one one-hundredth, or even one one-thousandth) of the surface area of the beam 302. In such an embodiment, the flexibility of the beam 302 may not be affected substantially by the presence of the transducer 404 thereon, and the,e flexibility of the unit including both the transducer 404 and the beam 302 is determined primarily by the flexibility of the beam 302. It should be appreciated that a similar result may also be accomplished in other ways. For example, a transducer 404 may be employed which is substantially more flexible that the beam 302 (or another structure) on which it is mounted. As is explained in more detail below, the effect that each of a transducer 404 and a beam 302 (or another structure) has on the flexibility of a unit including both elements can be appreciated by examining the position of the so-called neutral axis (explained below) of the unit which passes through the unit when the unit flexes.

Figure 6A:
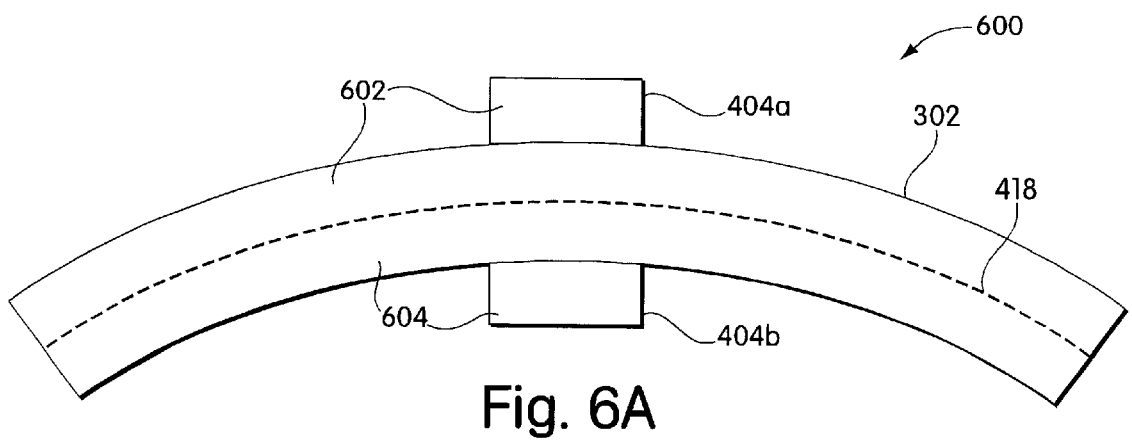
FIGS. 6A–C are illustrations showing how transducers may be supported by a structure so as not to substantially affect the flexibility of the structure.
Figure 6B:
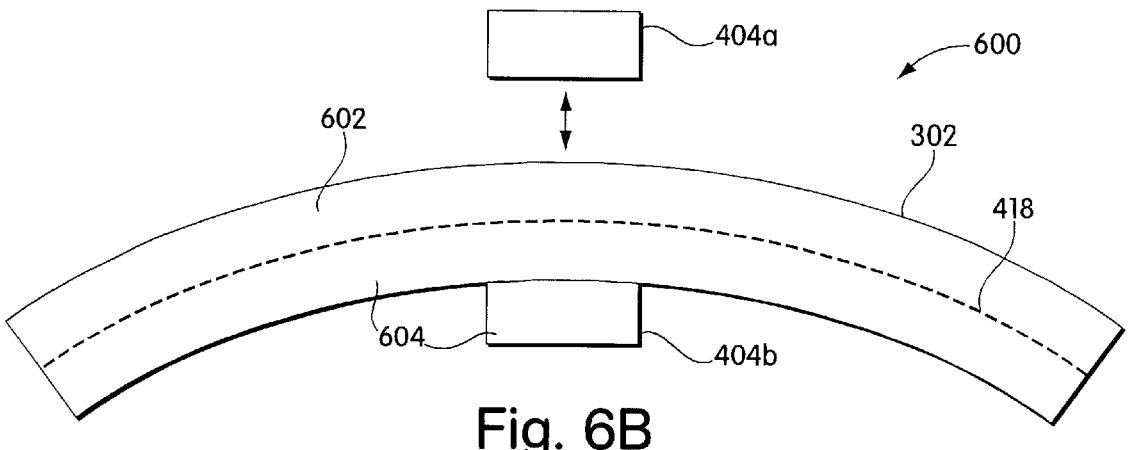
Figure 6C:
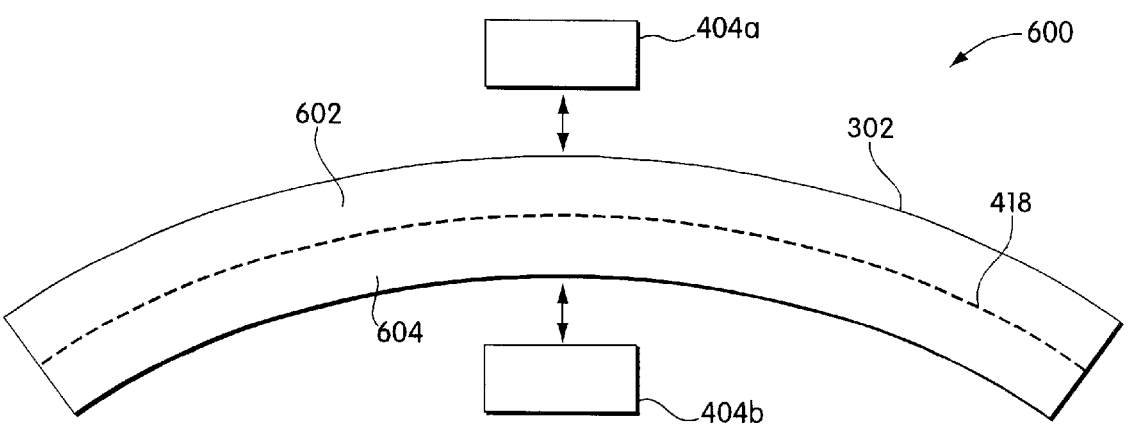

FIGS. 6A–C illustrate an example of how a flexible structure (e.g., the beam 302) and one or more transducers 404a–b may be configured and arranged such that mounting of each transducer 404 on the beam 302 does not substantially affect the position of a neutral axis 418 which passes through a unit 600 (including both the beam 302 and the transducer(s) 404) when the unit 600 is flexed. As shown in FIGS. 6A–C, the neutral axis 418 of the unit 600 is the axis that (when the unit 600 is flexed) separates the portion 602 of the unit 600 that is subjected to tension forces from the portion 604 of the unit 600 that is subjected to compression forces. The location of the neutral axis 418 may be affected, for example, by the relative sizes, positions, and flexibilities of the beam 302 and the transducer(s) 404, and/or the manner in which such elements are interconnected.

In the illustrative embodiment of FIGS. 6A–C, the position of the neutral axis 418 of the unit 600 is located at substantially the same location: (a) when both of the transducers 404a and 404b are attached to the beam 302 (FIG. 6A); (b) when only the transducer 404b is attached to the beam 302 (FIG. 6B); and (c) when neither of the traducers 404a and 404b is attached to the beam 302 (FIG. 6C). Therefore, the attachment or removal of either (FIG. 6B) or both (FIG. 6C) of the transducers 404a and 404b to or from the beam 302 does not substantially affect the position of the neutral axis 418 that passes through the unit 600. In the particular embodiment shown, the neutral axis 418 passes only through the beam 302, and does not pass trough either of the transducers 404a and 404b, regardless of whether either or both of the traducers 404a and 404b are attached to the beam 302. It should be understood that the other embodiments of the invention described herein may also incorporate this aspect of the invention. For example, in each of FIGS. 4B–C and 5B–C, the transducer 404 and the beam 302 (or another structure) may be constructed and arranged such that the position of the neutral axis 418 passes only through the beam 302, regardless of whether the transducer 404 is mounted thereto.

Figure 2:
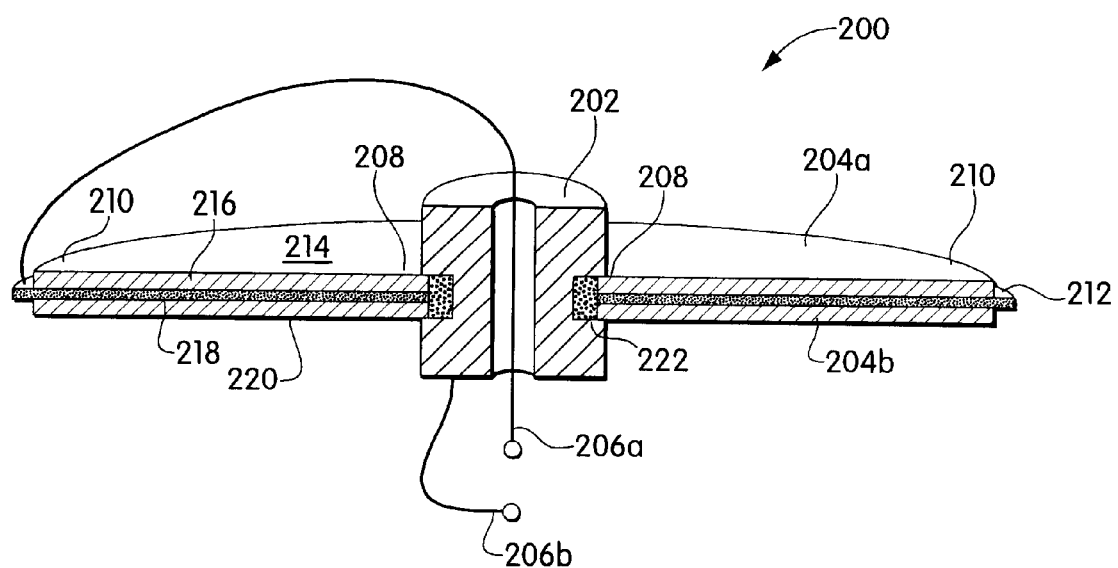
FIG. 2 is a diagram showing another example of a prior art accelerometer that employs a piezoceramic transducer.

Referring back to the device 200 of FIG. 2, it should be appreciated that, although a neutral axis of the unit including the circular conductor 212 and both of the piezoceramic elements 204a and 204b may pass through the circular conductor 212 (when the unit flexes), because of the structure, size, and position of the piezoceramic elements 204a and 204b, the removal of either of the piezoceramic elements 204a and 204b would substantially affect the location of the unit's neutral axis. In fact, it appears that the removal of only one of the piezoceramic elements 204a and 204b from the circular conductor 212 would cause the neutral axis of the unit including the circular conductor 212 and the remaining piezoceramnic element 204 to pass exclusively through the remaining piezoceramic element 204. Therefore, in contrast to the example of FIGS. 6A–C, the presence of each of the piezoceramic elements 204a and 204b in the FIG. 2 device has a substantial effect on the flexibility of the unit including the circular conductor 212 and the piezoceramic elements 204a and 204b.

Figure 7:
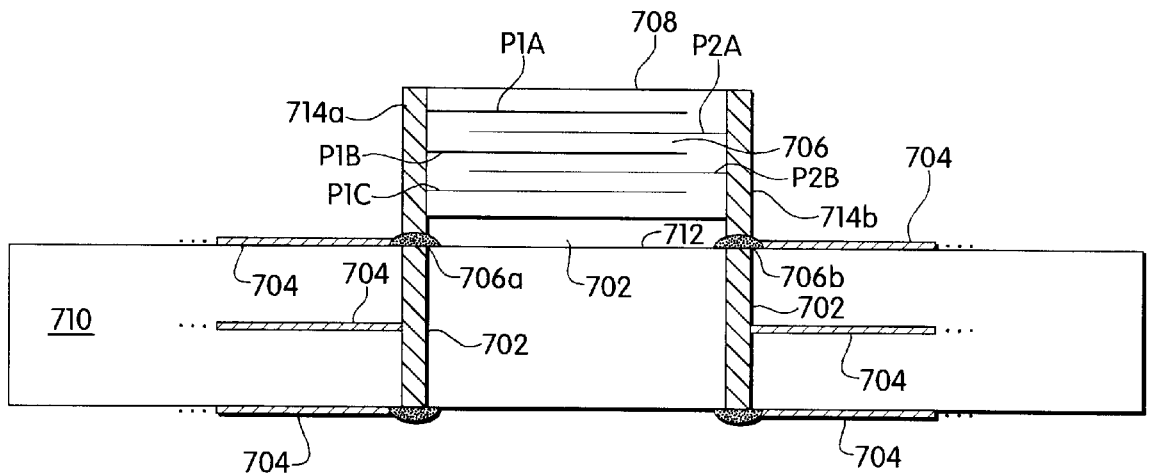
FIG. 7 is an illustration of a capacitor serving as a transducer mounted on a section of a circuit board according to another embodiment of the invention.

FIG. 7 shows an example of how a specific type of transducer, i.e., a multi-layer capacitor 708 having a piezoceramic dielectric 706, may be attached to a specific type of flexible structure, i.e., a section 710 of an organic-laminate circuit board material, so as to generate a signal responsive to changes in a specific characteristic of the circuit board section 710 (i.e., a distance between locations 706a and 706b on the circuit board's top surface 712) that occur when the circuit board section 710 flexes. As discussed in more detail below, the piezoceramic dielectric 706 of the capacitor 708 may generate a signal between pole conductors 714a–b of the capacitor 708 when it is compressed and/or stretched as the circuit board section 710 flexes. Therefore, when the circuit board section 710 is attached to an object (not shown) so that the circuit board section 710 is caused to flex in response to acceleration of the object, the signal generated between the pole conductors 714a and 714b of the capacitor 708 is indicative of the acceleration of the object. As with the embodiments discussed above, a controller (not shown) may be coupled to the capacitor 708 to receive the output signal therefrom, and may monitor the signal to monitor the acceleration of the object.

A capacitor suitable for use as the capacitor 708 in the FIG. 7 embodiment may, for example, be selected from the GRM series of monolithic ceramic capacitors available from Murata Electronics Distributors. Such capacitors are on the order of two millimeters (mm) long, one millimeter wide, and one millimeter thick, and may be mass-produced at a very low cost (e.g, one-tenth of one cent each). It should be appreciated, of course, that other capacitors having the desired piezoelectric characteristics may alternatively be,used, and that the invention is not limited to the particular type of capacitor shown and described.

As shown in FIG. 7, each of the plates P1 and P2 of the capacitor 708 may include multiple layers of conductors P1A–P1C and P2A–P2B, with the conductors P1A–P1C of one plate p1 being interdigitated with the conductors P2A–P2B of the other plate P2. While the capacitor 708 of FIG. 7 may function satisfactorily in the form in which it is originally produced by its manufacturer, it may be desirable to prepolarize the piezoceramic dielectric 706 of the capacitor 708 by placing a high, but non-destructive voltage (e.g., just below the capacitor's maximum voltage rating) between the capacitor's plates while maintaining the capacitor 708 at a temperature just below the Curie point of its ceramic dielectric 706.

The circuit board section 710 of the FIG. 7 embodiment may be made of any of numerous types of materials, and the invention in not limited to any particular type of circuit board material. In one embodiments for example, the circuit board section 710 is a section of an organic-laminate substrate. For the purposes of the present invention, such a circuit board is considered to be a "no-conductive" structure, even though it may have electrically conductive circuit traces and/or power/ground planes thereon or therein which may or may not be coupled to the capacitor 710 or other transducer used therewith to monitor acceleration.

In the illustrative embodiment of FIG. 7, the pole conductors 714a–b of the capacitor 708 electrically connect the plates P1 and P2 of the capacitor 708 to conductors 704 of the circuit board. In particular, in the FIG. 7 embodiment, the pole conductors 714a–b are inserted into vias 702 in the circuit board and are soldered therein so as to make electrical contact with the conductors 704. Alternatively, the pole conductors 714a–b may be pins of a surface-mounted device. In either case, the circuit traces 704 in the FIG. 7 embodiment may be electrically connected to other components in a circuit in which the capacitor 708 is included so that the capacitor 708 is electrically coupled to such components.

The characteristics of the capacitor 708 and the circuit board section 710, and the physical relationships therebetween, may be similar to the characteristics of and physical relationships between, the beams 302 or other surfaces and the transducers 404 used therewith discussed above in connection with FIGS. 4–6. For example, in one embodiment, the relative flexibilities of the circuit board section 710 and the capacitor 708 are such that the neutral axis of the combination passes through the circuit board section 710 regardless of whether the capacitor 708 is attached thereto.

Figure 8:
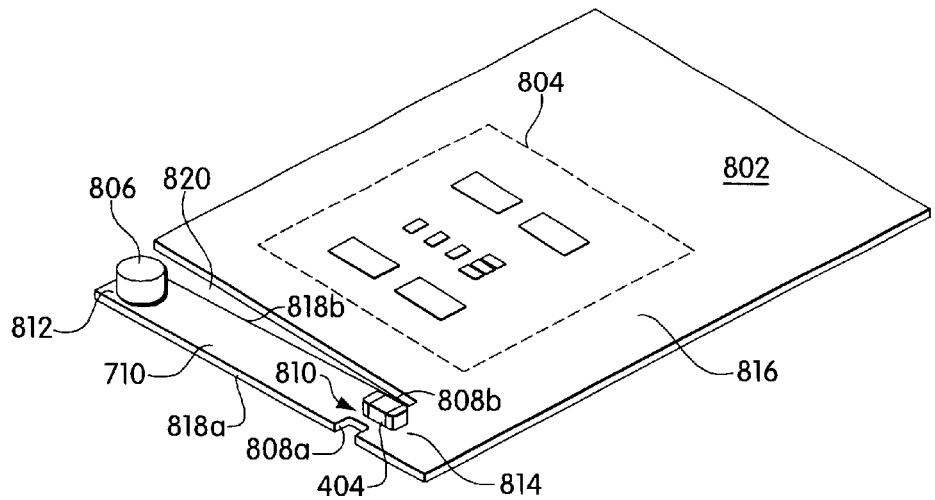
FIG. 8 is a perspective view of a circuit board that incorporates an accelerometer according to one embodiment of the invention.
Figure 9:
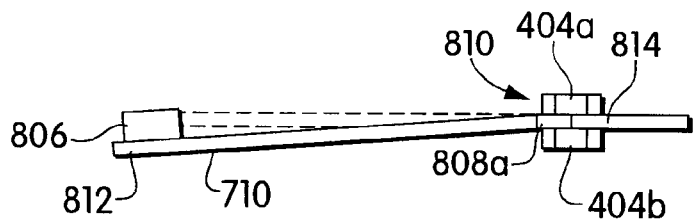
FIG. 9 is a side view of the accelerometer portion of the circuit board of FIG. 8.

FIGS. 8 and 9 show perspective and side views, respectively, of an illustrative embodiment of the invention wherein a transducer 404 (e.g., a capacitor having a piezoceramic dielectric such as that described in connection with FIG. 7) is mounted on a section 710 of a circuit board 802. In the embodiment shown, the circuit board 802 also includes a section 816 on which additional circuitry 804 is disposed. Such a structure may be formed, for example, by cutting or otherwise establishing a gap or slit 820 in the circuit board 802, or by prefabricating the circuit board 802 to include the beam-like section 710. In the embodiment shown, a distal end 812 of the circuit board section 710 is permitted to move when the section 816 of the circuit board 802 (or an object to which the section 816 is mounted) is accelerated.

While the embodiment of FIGS. 8 and 9 employs a circuit board 802 that includes separate beam-like 710 and circuitry 816 sections, it should be understood that the invention is not limited in this respect. For example, in some embodiments of the invention, the portion 816 of the circuit board 802 that has the additional circuitry 804 mounted thereon may itself be used as a structure whose flexing is to be monitored. In this regard, it should be appreciated that, as with the other embodiments described above, it is not necessary that the circuit board (or other structure) whose flexing is to be monitored be in the form of a beam. Instead, the structure whose flexing is to be monitored may, for example, be rectangular, circular, or any other shape.

In the embodiment of FIGS. 8 and 9, a pair of notches 808a and 808b are formed on the sides 818a and 818b of the circuit board section 710 near a location 810 along a longitudinal axis of the circuit board section 710 at which the transducer 404 is mounted. This placement of the notches 808a and 808b make the circuit board section 710 more narrow, and therefore more flexible, at the location 810 than at other locations along the circuit board section's longitudinal axis. Thus, inclusion of the notches 808a and 808b in the circuit board section 710 causes the circuit board section 710 to flex primarily at the location 810 when the section 816 of the circuit board 802 (or an object to which the section 816 is mounted) is accelerated. It should be appreciated, however, that the circuit boardsection 710 may be caused to flex primarily at the location 810 in alternative ways, and that the invention is not limited to the use of notches in the circuit board section 710 to cause such a result. For example, a different thickness and/or type of material may be used to form a portion of the circuit board section 710 at the location 810 than is used to form the remainder of the circuit board section 710, or the portion of the circuit board section 710 at the location 810 may otherwise be physically or chemically altered or weakened so as to make that portion 810 more flexible than the remainder of the circuit board section 710.

In the embodiment of FIGS. 8 and 9, a weight 806 is disposed on the distal end 812 of the circuit board section 710 to increase a moment force that is applied about a proximal end 814 of the circuit board section 710 when the section 816 of the circuit board 802 (or an object to which the section 810 to attached) is accelerated. This placement of the weight 806 therefore increases the sensitivity of the accelerometer. In this regard, it should be appreciated that the sensitivity of the accelerometer of FIGS. 8 and 9 may also be increased or decreased by adjusting the length of the circuit board section 710 or by altering its flexibility.

As illustrated in FIG. 9, in one embodiment of the invention, a pair of transducers 404a and 404b (e.g., capacitors having piezoceramic dielectrics) are mounted on opposite sides of the circuit board section 710 so that, whenever the bending of the circuit board section 710 causes one of the transducers 404a and 404b to be stretched, the other transducer 404 is compressed a corresponding amount, and vice versa. In this manner, the transducers 404a and 404b together can generate a differential signal indicative of the acceleration of the portion 816 circuit board 802 (or an object to which the section 816 is attached).

Figure 10:
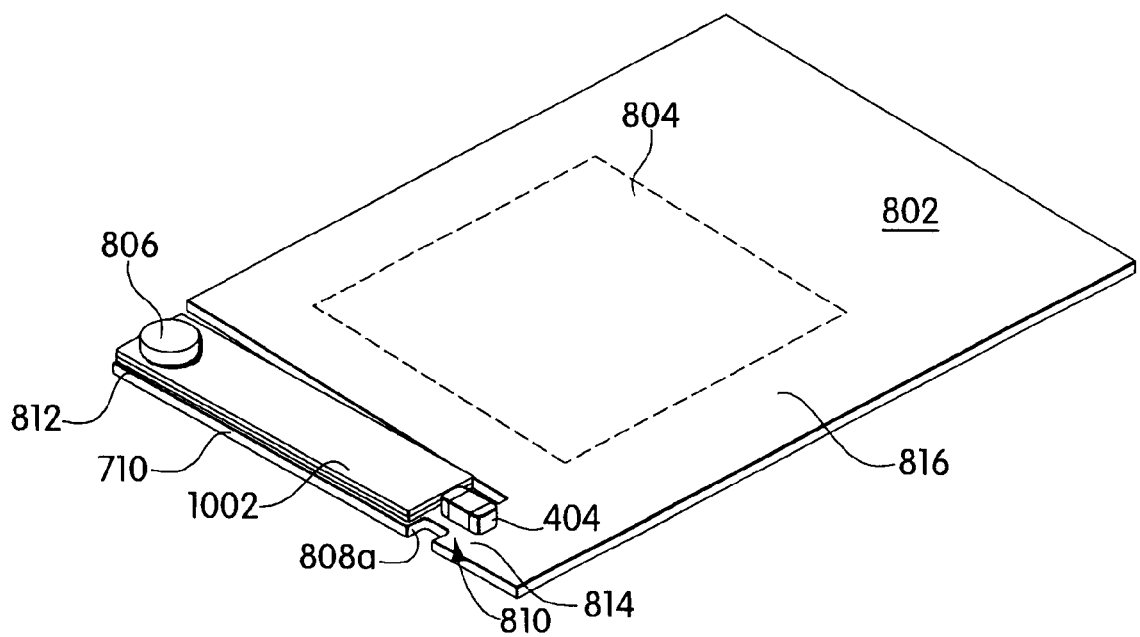
FIG. 10 is a perspective view of the circuit board of FIG. 8 wherein a shear damper is disposed on a beam of the accelerometer portion of the circuit board according to one embodiment of the invention.

FIG. 10 shows how the embodiment of FIGS. 8 and 9 may be modified by disposing a shear damper 1002 on a top surface of the circuit board section 710. The shear damper 1002 may, for example, be made of a material (e.g., plastic, metal, glass, fiberglass, or the like) that is substantially more rigid than the circuit board section 710. The use of such a shear damper may, for example, reduce the vibration of the circuit board section 710, and/or cause the circuit board section 710 to flex primarily at the location 810 when the section 816 of the circuit board 802 (or an object to which the section 816 is attached) is accelerated. While a shear damper 1002 of a particular shape (i.e., the same shape as the circuit board section 710) is used in the FIG. 10 embodiment, it should be appreciated that devices of other shapes which also are capable of dampening the shear of the circuit board section 710 may alternatively be employed, and that the invention is not limited to the particular shape of shear damper shown. It should also be appreciated that additional shear dampers may also be disposed on the circuit board section 710, e.g., one on each side, and that the invention is not limited to the use of a single shear dampening device.

Figure 11:
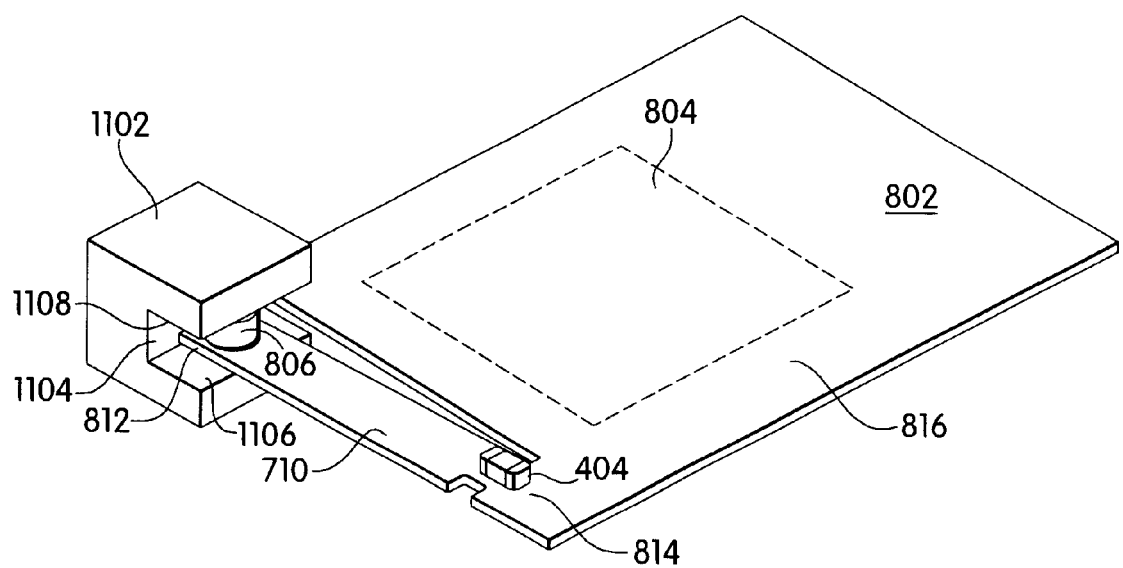
FIG. 11 is a perspective view of the circuit board of FIG. 8 wherein damping foam is disposed on a distal end of the beam of the accelerometer portion of the circuit board according to one embodiment of the invention.

FIG. 11 illustrates how the embodiments of FIGS. 8–10 may be modified by disposing a masse of damping foam 1102, or the like, on the distal end 812 of the circuit board section 710. In the embodiment shown, an opening 1104 in the damping foam 1102 surrounds the distal end 812 and the weight 806 such that inner surfaces 1106 and 1108 of the damping foam 1102 exert compression forces on the weight 806 and the distal end 812 to hold the damping foam 1102 in place on the distal end 812 of the circuit board section 710. The damping foam 1102 may, for example, be placed near or in contact with a casing (not shown) in which the circuit board 802 is disposed. In such an embodiment, the damping foam 1102 may contact the casing when the distal end 812 of the circuit board section 710 moves, and thereby dampen the motion of the distal end 812. The use of the damping foam 1102, or the like, in this manner may, for example, reduce the ringing in the signal output by the transducer 404.

Figure 12A:
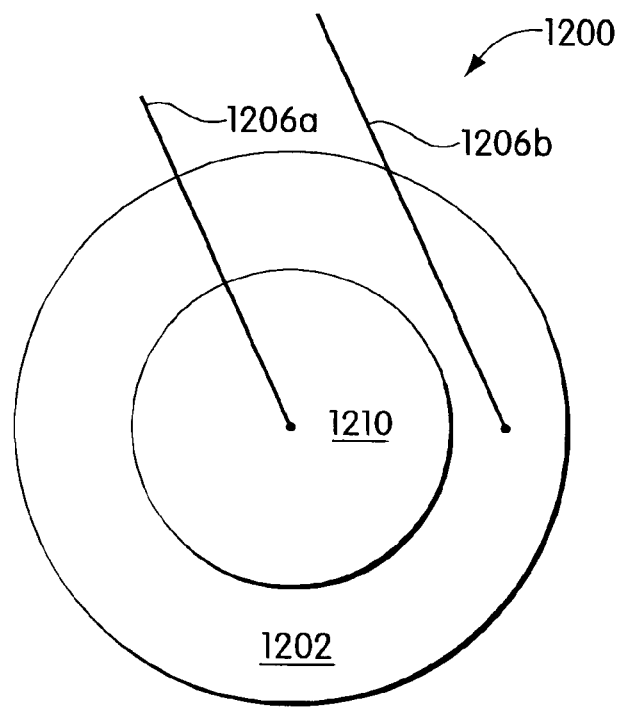
FIGS. 12A–B show top and side views of a piezoceramic element typically used in a speaker or microphone that may be used to measure acceleration of an object in accordance with one embodiment of the invention.
Figure 12B:
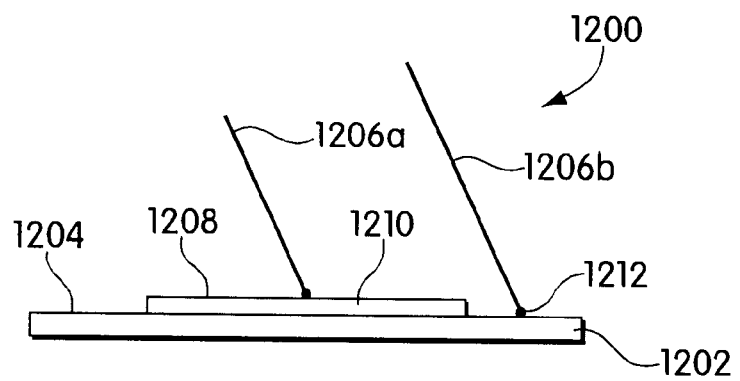

In an alternative embodiment of the invention, a disk-shaped element (including a piezoelectric transducer or the like), e.g., the type typically used in microphones or speakers, may be used to monitor acceleration of an object by properly mounting the element to the object and monitoring a signal output by the transducer included therein. Top and side-views of an example embodiment of a disk-shaped element 1200 that may be used for this purpose are shown in FIGS. 12A–B, respectively. An example of one such disk-shaped element is part number CD11BB, manufactured by Taiyo Yuden. In the example shown in FIGS. 12A–B, the disk-shaped element 1200 includes a flat, disk-shaped metal support 1202, and a flat, disk-shaped section of piezoceramic material 1210 concentrically arranged on a top surface 1204 of the support disk 1202. As shown, conductors 1206a–b may be connected, respectively, to a top surface 1208 of the piezoceramic disk 1210 and to a portion 1212 of the conductive support disk 1202.

Figure 13:
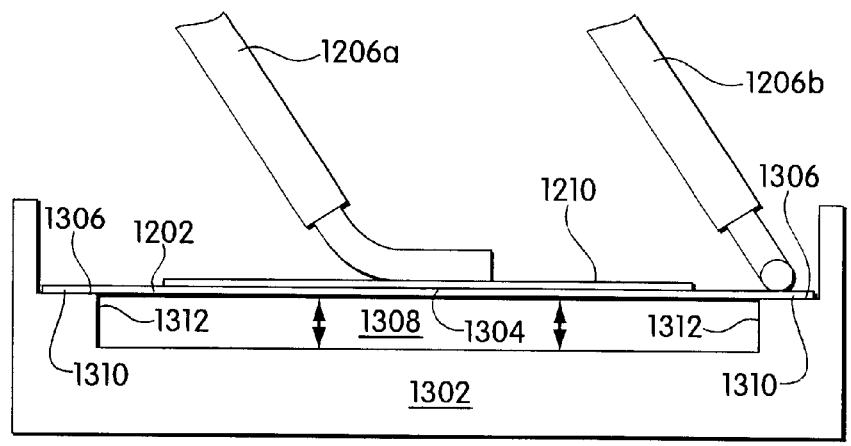
FIG. 13 illustrates how the piezoceramic element of FIGS. 12A–B may be mounted in a base so as to measure acceleration of the base in accordance with one embodiment of the invention.

FIG. 13 illustrates an example of how the disk-shaped element 1200 of FIG. 12 may be supported by a base 1302 (i.e., an object whose acceleration is to be monitored) so that a signal generated between the conductors 1206a–b of the element 1200 is indicative of the acceleration of the base 1302 (the object). In the example shown, an outer portion 1310 of the support disk 1202 is secured to (e.g., using an epoxy or other substance or technique) a circular shelf 1306 of the base 1302. As shown, a cylindrical ledge 1312 drops off from the circular shelf 1306 to form a cavity 1308 within the base 1302. When the base 1302 (the object) is accelerated, the support disk 1202 is caused to flex such that a center portion 1304 of the support disk 1202 is caused to move up and down within the cavity 1308 of the base, 1302 (as indicated by the arrows in FIG. 13). Because the piezoceramic disk 1210 generates a signal in response to the flexing of the support disk 1202, the signal generated between the conductors 1206a–b when the base 1302 (the object) is accelerated is indicative of the acceleration of the base 1302. A controller (not shown) may be coupled to the conductors 1206 to receive the output signal therefrom, and may monitor the signal to monitor the acceleration of the base 1302.

In some embodiments, the characteristics of the piezoceramic disk 1210 and the support disk 1202, and the physical relationships therebetween, may be similar to the characteristics of, and the physical relationships between, the beams 302 or other surfaces and the transducers 404 used therewith discussed above in connection with FIGS. 4–6. For example, in some embodiments, the relative flexibilities of the support disk 1202 and the piezoceramic disk 1210 may be such that the neutral axis of the combination passes through the support disk 1202 regardless of whether the piezoceramic disk 1210 is attached thereto.

Figure 14:
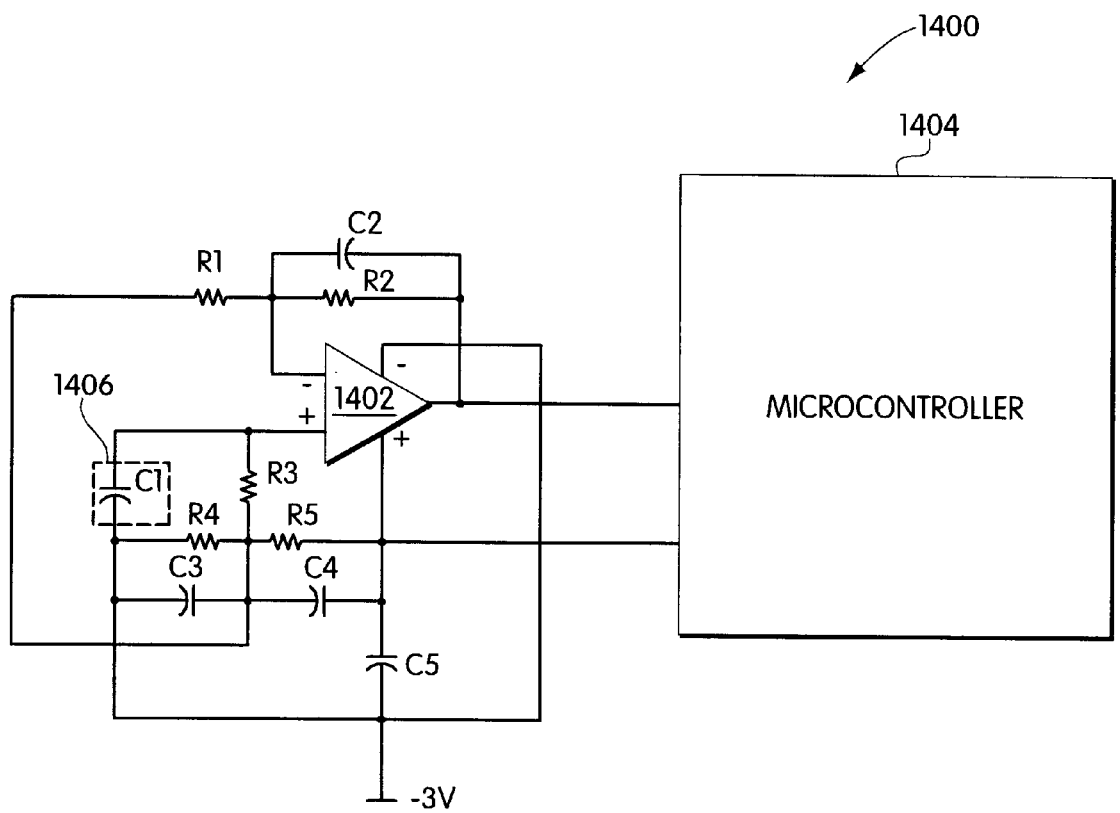
FIG. 14 is a schematic diagram of a circuit in which a transducer used to monitor the flexing of a structure may be included in accordance with one embodiment of the invention.

FIG. 14 is a schematic diagram showing an illustrative embodiment of an electronic circuit 1400 in which an element 1406 used as a transducer to monitor the flexing or other characteristics of a structure in response to acceleration of an object to which the structure is attached may be included. The element 1406 may correspond, for example, to the transducer 404 of FIGS. 4–6 and 7–11, to the capacitor 708 of FIG. 7, or the disk-shaped element 1200 of FIGS. 12 and 13. The components in the circuit 1400 (other than the element 1406) may, for example, be included in the additional circuitry 804 shown in FIGS. 8, 10, and 11. In the illustrative embodiment of FIG. 14, the element 1406 has a well-defined capacitance associated therewith (e.g., it may be a capacitor having a piezoceramic or another piezoelectric dielectric), and is therefore used as a capacitor C1 in the circuit 1400, in addition to being used as a transducer. In the example shown, the circuit 1400 additionally includes an amplifier 1402, a controller 1404, capacitors C2–C5, and resistors R1–R5.

In the illustrative embodiment of FIG. 14, the amplifier 1402 is coupled to the element 1406 to receive and amplify a signal generated thereby. The controller 1404 in the embodiment shown may, for example, include a microprocessor which includes an on-board analog-to-digital converter. The controller 1404 in such an embodiment may, for example, convert the output of the amplifier 1402 into a digital signal and analyze the digital signal to monitor the acceleration of an object. The purpose and function of each of the other components will be readily understood to one skilled in the art, and therefore will not be discussed further.

When the circuit 1400 is disposed on a circuit board (e.g., the circuit board 802 of FIGS. 8, 10, and 11) such that the element 1406 generates a signal responsive to flexing of the circuit board (or a portion thereof), the element 1406 and circuit board together function as an accelerometer. Therefore, any circuit board may conceivably be modified to sense acceleration of an object to which it is attached simply by properly placing a transducer on the circuit board so as to generate a signal responsive to the flexing of the circuit board.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. A method for monitoring acceleration of an object, comprising steps of:
  (a) providing an apparatus including a structure that flexes in response to acceleration of the object, and at least one transducer having first and second ends and a middle portion therebetween, wherein the first and second ends of the at least one transducer are mechanically coupled to respective first and second locations on a surface of the structure, without the middle portion being mechanically coupled to the structure, so that the at least one transducer generates a signal responsive changes in a distance between the first and second locations that occur as the structure flexes;

(b) mounting the apparatus to the object; and (c) monitoring the acceleration of the object based upon the signal.

2. The method of claim 1, wherein the first and second ends of the at least one transducer are mechanically coupled to the first and second locations on the surface of the structure via respective first and second conductors of the at least one transducer between which the at least one transducer generates the signal.

3. The method of claim 2, wherein the at least one transducer includes a capacitor having first and second plates and a piezoelectric dielectric disposed therebetween, the capacitor having first and second electrodes coupled to the first and second plates, respectively, the first and second electrodes serving as the first and second conductors, respectively, of the at least one transducer.

4. A method for monitoring acceleration of an object, comprising steps of:

(a) providing an apparatus including a structure that flexes in response to acceleration of the object, and at least one capacitor having first and second plates with a piezoelectric dielectric disposed therebetween, and first and second electrodes connected to the first and second plates, respectively, the at least one capacitor further comprising an electrically insulated housing in which the first and second plates and the piezoelectric dielectric are disposed, and wherein the first and second electrodes of the at least one capacitor penetrate the housing to permit the plates of the at least one capacitor to be connected to circuit elements outside the housing via the first and second electrodes, the at least one capacitor being configured and arranged on the structure to generate a signal between the first and second plates responsive to flexing of the structure;

(b) mounting the apparatus to the object; and (c) monitoring the acceleration of the object based upon the signal.

5. The method of claim 4, wherein the at least one capacitor is a multilayer capacitor.

6. A device for monitoring acceleration of an object, comprising:

an apparatus including a structure that flexes in response to acceleration of the object, and at least one transducer having first and second ends and a middle portion therebetween, wherein the first and second ends of the at least one transducer are mechanically coupled to respective first and second locations on a surface of the structure, without the middle portion being mechanically coupled to the structure, so that the at least one transducer generates a signal responsive changes in a distance between the first and second locations that occur as the structure flexes; and a controller, coupled to the apparatus to receive the signal therefrom, that monitors the acceleration of the object based upon the signal.

7. A device for monitoring acceleration of an object, comprising:

an apparatus including a structure that flexes in response to acceleration of the object, and at least one capacitor having first and second plates with a piezoelectric dielectric disposed therebetween, and having first and second electrodes connected to the first and second plates, respectively, the at least one capacitor further having an electrically insulated housing in which the first and second plates and the piezoelectric dielectric are disposed, and wherein the first and second electrodes of the at least one capacitor penetrate the housing to permit the plates of the at least one capacitor to be connected to circuit elements outside the housing via the first and second electrodes, the at least one capacitor being configured and arranged on the structure to generate a signal between the first and second plates responsive to flexing of the structure; and a controller, coupled to the apparatus to receive the signal therefrom, that monitors the acceleration of the object based upon the signal.

8. The method of claim 3, wherein the capacitor comprises an electrically insulated housing in which the first and second plates and the piezoelectric dielectric are disposed, and wherein the first and second electrodes of the capacitor penetrate the housing to permit the plates of the capacitor to be connected to circuit elements outside the housing via the first and second electrodes.

9. The method of claim 1, wherein a first section of the structure is supported by the object, and a second section of the structure is left unsupported so that the second section of the structure is free to move in response to acceleration of the object.

10. The method of claim 1, wherein the structure is formed as an extension of a circuit board.

11. The method of claim 10, wherein the structure is formed as a contiguous extension of the circuit board.

12. The method of claim 11, wherein the circuit board has a plurality of electronic components disposed thereon, and wherein at least one electrode of the at least one transducer is coupled to at least one of the plurality of electronic components.

13. The method of claim 4, wherein the first and second electrodes are attached to respective first and second locations on a surface of the structure so that bending the structure in a first direction causes the capacitor to be stretched and bending the structure in a second direction causes the capacitor to be compressed.

14. The method of claim 4, wherein a first section of the structure is supported by the object, and a second section of the structure is left unsupported so that the second section of the structure is free to move in response to acceleration of the object.

15. The method of claim 4, wherein the structure is formed as an extension of a circuit board.

16. The method of claim 15, wherein the structure is formed as a contiguous extension of the circuit board.

17. The method of claim 16, wherein the circuit board has a plurality of electronic components disposed thereon, and wherein at least one of the first and second electrodes of the at least one capacitor is coupled to at least one of the plurality of electronic components.

18. The device of claim 6, wherein the first and second ends of the at least one transducer are mechanically coupled to the first and second locations on the surface of the structure via respective first and second conductors of the at least one transducer between which the at least one transducer generates the signal.

19. The device of claim 18, wherein the at least one transducer includes a capacitor having first and second plates and a piezoelectric dielectric disposed therebetween, the capacitor having first and second electrodes coupled to the first and second plates, respectively, the first and second electrodes serving as the first and second conductors, respectively, of the at least one transducer.

20. The device of claim 19, wherein the piezoelectric dielectric includes a piezocearc dielectric.

21. The device of claim 6, wherein the structure includes a beam.

22. The device of claim 19, wherein the capacitor comprises an electrically insulated housing in which the first and second plates and the piezoelectric dielectric are disposed, and wherein first and second electrodes of the capacitor penetrate the housing to permit the plates of the capacitor to be connected to circuit elements outside the housing via the first and second electrodes.

23. The device of claim 6, wherein the apparatus is mounted to the object such that a first section of the structure is supported by the object, and a second section of the structure is left unsupported so that the second section of the structure is free to move in response to acceleration of the object.

24. The device of claim 23, wherein the apparatus further includes a weight supported by the second section of the structure, the weight being mounted to the structure to increase an amount that the second section of the structure moves in response to acceleration of the object.

25. The device of claim 23, wherein the at least one transducer is attached to the structure at a location near the first section of the structure.

26. The device of claim 23, wherein the apparatus further includes a mass of damping material, the damping material being mounted to the second section of the structure to constrain a range of motion of the second section of the structure.

27. The device of claim 6, wherein the apparatus further includes a shear damper, mounted along at least a portion of a length of the structure, to inhibit the structure from shearing along the portion of the length of the structure that is covered by the shear damper.

28. The device of claim 6, wherein the structure is formed as an extension of a circuit board.

29. The device of claim 28, wherein the structure is formed as a contiguous extension of the circuit board.

30. The device of claim 29, wherein the circuit board has a plurality of electronic components disposed thereon, and wherein at least one electrode of the at least one transducer is coupled to at least one of the plurality of electronic components.

31. The device of claim 6, wherein the structure is formed of an organic-laminate material.

32. The device of claim 6, wherein the at least one transducer covers less than one fourth of the surface area of the structure.

33. The device of claim 6, wherein the at least one transducer covers less than one tenth of the surface area of the structure.

34. The device of claim 6, wherein the structure is non-circular.

35. The device of claim 6, wherein the structure is non-electrically conductive.

36. The device of claim 6, wherein the structure and the first transducer are constructed and arranged such that a neutral axis passes through the structure when the structure flexes, and such that the neutral axis would still pass through the structure when the structure flexes if the first transducer were removed from the structure.

37. The device of claim 36, wherein the structure and the first transducer are constructed and arranged such that the neutral axis passes exclusively through the structure when the structure flexes, and such that the neutral axis would still pass exclusively through the structure when the structure flexes if the first transducer were removed from the structure.

38. The device of claim 6, wherein the apparatus further includes a second transducer supported by the structure, and wherein the first and second transducers are constructed and arranged so that the neutral axis passes through the structure when the structure flexes, and such that the neutral axis would still pass through the structure when the structure was flexed if either one of the first and second transducers were removed from the structure.

39. The device of claimed 38, wherein the structure and the first and second transducers are constructed and arranged so that the neutral axis passes exclusively through the structure when the structure flexes, and so that the neutral axis would still pass exclusively through the structure when the structure was flexed if either one of the first and second transducers were removed from the structure.

40. The device of claim 7, wherein the at least one capacitor is a multi-layer capacitor.

41. The device of claim 7, wherein the piezoelectric dielectric includes a piezoceramic dielectric.

42. The device of claim 7, wherein the structure is a beam.

43. The device of claim 7, wherein the first and second electrodes are attached to respective first and second locations on a surface of the structure so that bending the structure in a first direction causes the capacitor to be stretched and bending the structure in a second direction causes the capacitor to be compressed.

44. The device of claim 7, wherein the apparatus is mounted to the object such that a first section of the structure is supported by the object, and a second section of the structure is left unsupported so that the second section of the structure is free to move in response to acceleration of the object.

45. The device of claim 44, wherein the apparatus further includes a weight supported by the second section of the structure, the weight being mounted to the structure to increase an amount that the second section of the structure moves in response to acceleration of the object.

46. The device of claim 44, wherein the at least one transducer is attached to the structure at a location near the first section of the structure.

47. The device of claim 44, wherein the apparatus further includes a mass of damping material, the damping material being mounted to the second section of the structure to constrain a range of motion of the second section of the structure.

48. The device of claim 7, wherein the apparatus further includes a shear damper, mounted along at least a portion of a length of the structure, to inhibit the structure from shearing along the portion of the length of the structure that is covered by the shear damper.

49. The device of claim 7, wherein the structure is formed as an extension of a circuit board.

50. The device of claim 49, wherein the structure is formed as a contiguous extension of the circuit board.

51. The device of claim 50, wherein the circuit board has a plurality of electronic components disposed thereon, and wherein at least one of the first and second electrodes of the at least one capacitor is coupled to at least one of the plurality of electronic components.

52. The device of claim 7, wherein the structure is formed of an organiclaminate material.

53. The device of claim 7, wherein the at least one transducer covers less than one fourth of the surface area of the structure.

54. The device of claim 7, wherein the at least one transducer covers less than one tenth of the surface area of the structure.

55. The device of claim 7, wherein the structure is non-circular.

56. The device of claim 7, wherein the structure is non-electrically conductive.

57. The device of claim 7, wherein the structure and the first transducer are constructed and arranged such that a neutral axis passes through the structure when the structure flexes, and such that the neutral axis would still pass through the structure when the structure was flexed if the first transducer were removed from the structure.

58. The device of claim 57, wherein the structure and the first transducer are constructed and arranged such that the neutral axis passes exclusively through the structure when the structure flexes, and such that the neutral axis would still pass exclusively through the structure when the structure flexes if the first transducer were removed from the structure.

59. The device of claim 7, wherein the apparatus further includes a second transducer supported by the structure, and such that the structure and the first and second transducers are constructed and arranged so that the neutral axis passes through the structure when the structure flexes, and such that the neutral axis would still pass through the structure when the structure was flexed if either one of the first and second transducers were removed from the structure.

60. The device of claim 59, wherein the structure and the first and second transducers are constructed and arranged so that the neutral axis passes exclusively through the structure when the structure flexes, and such that the neutral axis would still pass exclusively through the structure when the structure was flexed if either one of the first and second transducers were removed from the structure.

61. An apparatus, comprising:

a circuit board having a plurality of electronic components mounted thereon and circuit traces disposed thereon or therein to interconnect the electronic components;

an object supporting the circuit board such that at least one section portion of the circuit board is permitted to flex when the object is accelerated;

at least one transducer supported by the section of the circuit board so as to generate a signal responsive to flexing of the section of the circuit board; and a controller, coupled to the at least one transducer to receive the signal therefrom, that monitors the acceleration of the object based upon the signal.

62. The apparatus of claim 61, wherein the at least one transducer is supported by the circuit board so as to generate the signal responsive to expansions and contractions that occur on or within the section of the circuit board as the section of the circuit board flexes when the object is accelerated.

* * * * *